(12) United States Patent
Yang et al.

(10) Patent No.: US 11,948,614 B2
(45) Date of Patent: Apr. 2, 2024

(54) METHODS OF MANUFACTURING AT LEAST A PORTION OF A MAGNETIC LAYER OF A MAGNETIC RECORDING DISK, AND RELATED MAGNETIC RECORDING DISKS

(71) Applicant: Seagate Technology LLC, Fremont, CA (US)

(72) Inventors: Xiaomin Yang, Livermore, CA (US); Kim Yang Lee, Fremont, CA (US); Thomas Young Chang, Menlo Park, CA (US); ShuaiGang Xiao, San Ramon, CA (US); Sha Zhu, Fremont, CA (US)

(73) Assignee: Seagate Technology LLC, Fremont, CA (US)

( * ) Notice: Subject to any disclaimer, the term of this patent is extended or adjusted under 35 U.S.C. 154(b) by 230 days.

(21) Appl. No.: 17/676,664

(22) Filed: Feb. 21, 2022

(65) Prior Publication Data

US 2023/0267959 A1 Aug. 24, 2023

(51) Int. Cl.
*G11B 5/84* (2006.01)
*G03F 7/00* (2006.01)
*G03F 7/36* (2006.01)

(52) U.S. Cl.
CPC .............. *G11B 5/84* (2013.01); *G03F 7/0002* (2013.01); *G03F 7/36* (2013.01)

(58) Field of Classification Search
None
See application file for complete search history.

(56) References Cited

U.S. PATENT DOCUMENTS

| | | | |
|---|---|---|---|
| 5,815,343 A | 9/1998 | Ishikawa et al. | |
| 7,081,268 B2 | 7/2006 | Chang et al. | |
| 7,429,427 B2 | 9/2008 | Wu et al. | |
| 7,986,493 B2 | 7/2011 | Weller et al. | |
| 8,021,713 B2 | 9/2011 | Jayashankar | |
| 8,460,565 B2 | 6/2013 | Lee et al. | |
| 8,748,017 B2 | 6/2014 | Sakurai et al. | |
| 9,324,353 B2 | 4/2016 | Hellwig et al. | |
| 9,431,219 B1* | 8/2016 | Cushen | H01L 21/3065 |
| 10,793,944 B2 | 10/2020 | Wang et al. | |
| 2005/0196606 A1 | 9/2005 | Ihara et al. | |
| 2006/0023329 A1 | 2/2006 | Tagami | |

(Continued)

FOREIGN PATENT DOCUMENTS

| | | |
|---|---|---|
| EP | 1653451 A1 | 5/2006 |
| JP | 5192993 B2 | 5/2013 |

OTHER PUBLICATIONS

Unpublished Utility U.S. Appl. No. 17/676,650, filed Feb. 21, 2022 (no attachment).

(Continued)

*Primary Examiner* — Shamim Ahmed
(74) *Attorney, Agent, or Firm* — Kagan Binder, PLLC

(57) ABSTRACT

The present disclosure relates to methods of manufacturing at least a portion of a magnetic layer of a magnetic recording disk. The methods include forming a plurality of sacrificial, discrete structures via imprint lithography. The sacrificial, discrete structures are used to form a plurality of three-dimensional segregant structures in a magnetic layer of the magnetic recording disk. The present disclosure also relates to corresponding magnetic recording disks.

20 Claims, 6 Drawing Sheets

(56) References Cited

U.S. PATENT DOCUMENTS

| | | | | |
|---|---|---|---|---|
| 2009/0135518 A1* | 5/2009 | Weller | .................... | G11B 5/82 |
| | | | | 360/110 |
| 2012/0069467 A1 | 3/2012 | Li | | |
| 2012/0217220 A1* | 8/2012 | Dobisz | ................. | G03F 7/0002 |
| | | | | 216/41 |
| 2016/0342089 A1* | 11/2016 | Ruiz | .................... | G03F 7/0002 |

OTHER PUBLICATIONS

Weller et al., "Review Article: FePt heat assisted magnetic recording media," Journal of Vacuum Science & Technology B, vol. 34, Issue 6, pp. 060801-1-060801-10, 2016, (11 pages).

Sundar et al., "Novel Scheme for Producing Nanoscale Uniform Grains Based on Templated Two-Phase Growth," Nano Letters, vol. 14, Issue 3, pp. 1609-1613, 2014, (5 pages).

\* cited by examiner

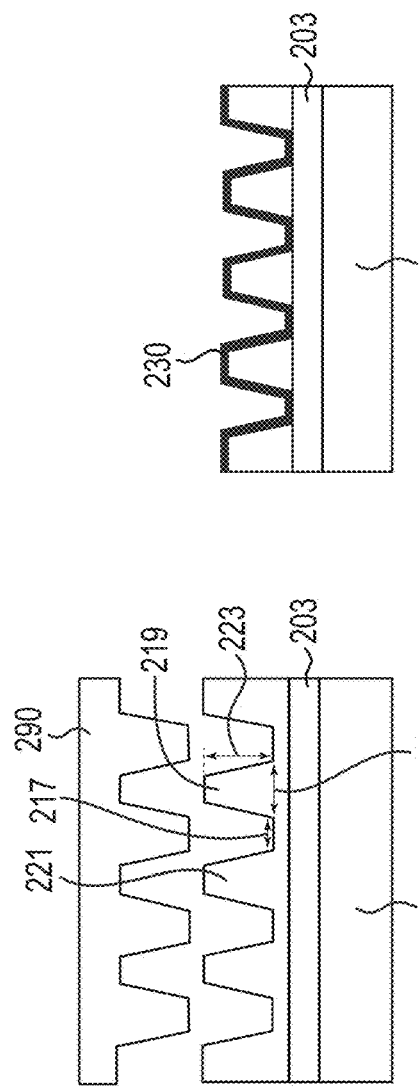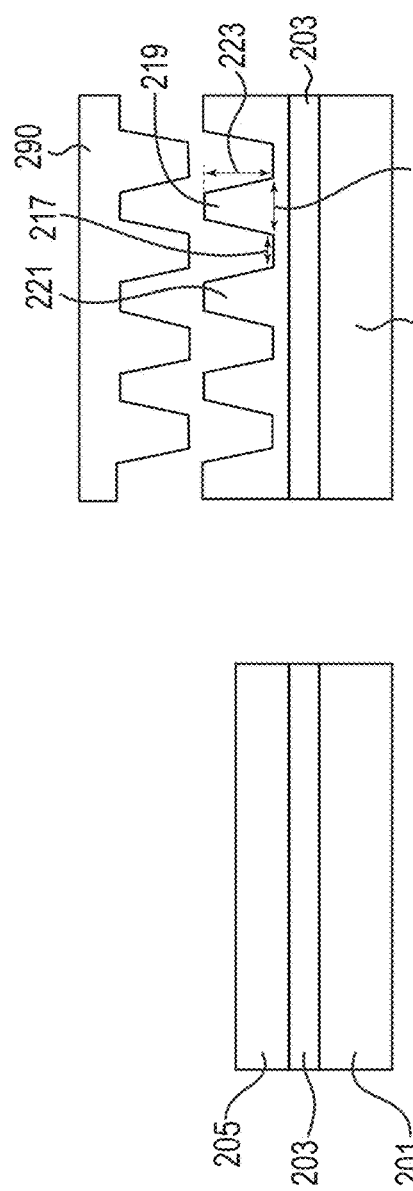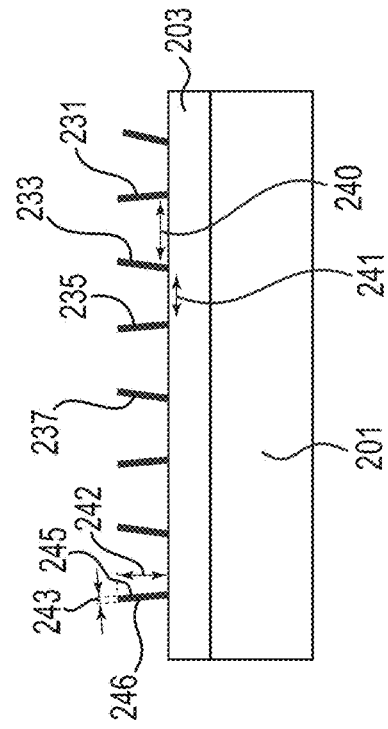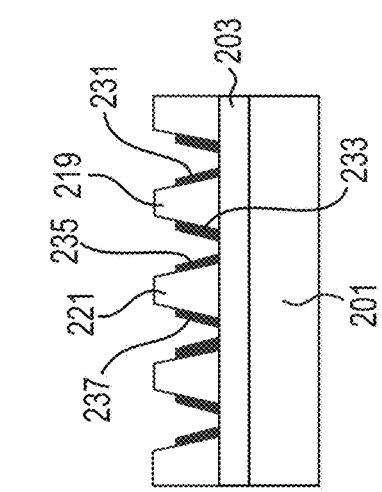

bridgeMETHODS OF MANUFACTURING AT LEAST A PORTION OF A MAGNETIC LAYER OF A MAGNETIC RECORDING DISK, AND RELATED MAGNETIC RECORDING DISKS

CROSS-REFERENCE TO RELATED APPLICATIONS

The present nonprovisional application is related to patent application having application Ser. No. 17/676,650 filed on Feb. 21, 2022 by Xiao et al., titled "METHODS OF MANUFACTURING AT LEAST A PORTION OF A MAGNETIC LAYER OF A MAGNETIC RECORDING DISK, AND RELATED MAGNETIC RECORDING DISKS", wherein the entirety of said nonprovisional application is incorporated herein by reference.

BACKGROUND

The present disclosure relates to magnetic layers in magnetic recording media, and related methods of manufacture. There is a continuing need to improve magnetic recording media and related methods of manufacture, e.g., in a manner that improves the signal to noise ratio.

SUMMARY

The present disclosure includes embodiments of a method of manufacturing at least a portion of a magnetic layer of a magnetic recording disk, wherein the method includes:
  providing a substrate having at least a first major surface;
  forming a pattern on the first major surface of the substrate, wherein the pattern includes a plurality of sacrificial, discrete structures, wherein each sacrificial, discrete structure comprises imprint resist material, wherein each sacrificial, discrete structure extends from a first radius of the recording disk to a second radius of the recording disk, and wherein each sacrificial, discrete structure includes:
    a base in contact with the first major surface of the substrate; and
    an exterior surface having a shape, wherein the exterior surface includes an end that is opposite the base;
  depositing at least one layer of segregant material so that the at least one layer of segregant material conforms to the shape of the exterior surface of each sacrificial, discrete structure;
  removing a portion of the at least one layer of segregant material in a direction from the end of each sacrificial, discrete structure toward the substrate to expose at least the end of each sacrificial, discrete structure, wherein a portion of the at least one layer of segregant material remains to define a plurality of three-dimensional segregant structures in contact with the first major surface of the substrate; and
  removing each sacrificial, discrete structure to expose the substrate and so that each three-dimensional segregant structure has at least two sidewalls that protrude from the substrate, wherein each three-dimensional segregant structure extends from the first radius of the recording disk to the second radius of the recording disk.

The present disclosure also includes embodiments of a magnetic recording disk including:
  a substrate comprising at least a first major surface;
  a nucleation layer present on the first major surface; and
  a magnetic recording layer present on the nucleation layer, wherein the magnetic recording layer includes:
    a plurality of three-dimensional segregant structures, wherein each three-dimensional segregant structure extends from a first radius of the recording disk to a second radius of the recording disk, and wherein each three-dimensional segregant structure is made of a first segregant material; and
    a plurality of magnetic grains between adjacent three-dimensional segregant structures; and
    a second segregant material between adjacent magnetic grains.

BRIEF DESCRIPTION OF THE DRAWINGS

FIGS. 2A-2D, 2F, and 2G are schematic elevation views of an embodiment of a method of manufacturing at least a portion of a magnetic layer of a magnetic recording disk according to the present disclosure;
FIG. 2D is a close-up view of FIG. 2C.

DETAILED DESCRIPTION

The present disclosure relates to a magnetic recording layer in magnetic recording disks, and related methods of manufacturing such magnetic recording layers.

Magnetic recording media are widely used in various applications, particularly in the computer industry for data/information storage and retrieval applications, typically in disk form. Nonlimiting examples of magnetic recording disks are described in U.S. Pat. Nos. U.S. Pat. No. 7,986,493 (Weller et al.) and U.S. Pat. No. 9,324,353 (Hellwig et al.), wherein the entirety of each of said patents is incorporated herein by reference.

Three-dimensional segregant structures are included in a magnetic recording layer according to the present disclosure prior to growing magnetic grains. By including three-dimensional segregant structures in a magnetic recording layer, at least some of the magnetic grains can grow so that that the portion of each magnetic grain that is adjacent to an edge of a given three-dimensional segregant structure aligns with the edge of the three-dimensional segregant structure, which can facilitate relatively sharp transitions during, e.g., writing to a magnetic recording disk. Having relatively more sharp transitions can improve (increase) the signal to noise ratio. In some embodiments, because magnetic grains are relatively more aligned instead of random arranged, a relatively more uniform thermal gradient can occur during write operations, e.g., during heat-assisted magnetic recording (HAMR).

A non-limiting example of a magnetic recording layer in a magnetic recording disk according to the present disclosure is described herein below with respect to FIGS. 1A-1C. It is noted that FIGS. 1A-1C are schematic drawings and are not drawn to scale.

Figure 1A:
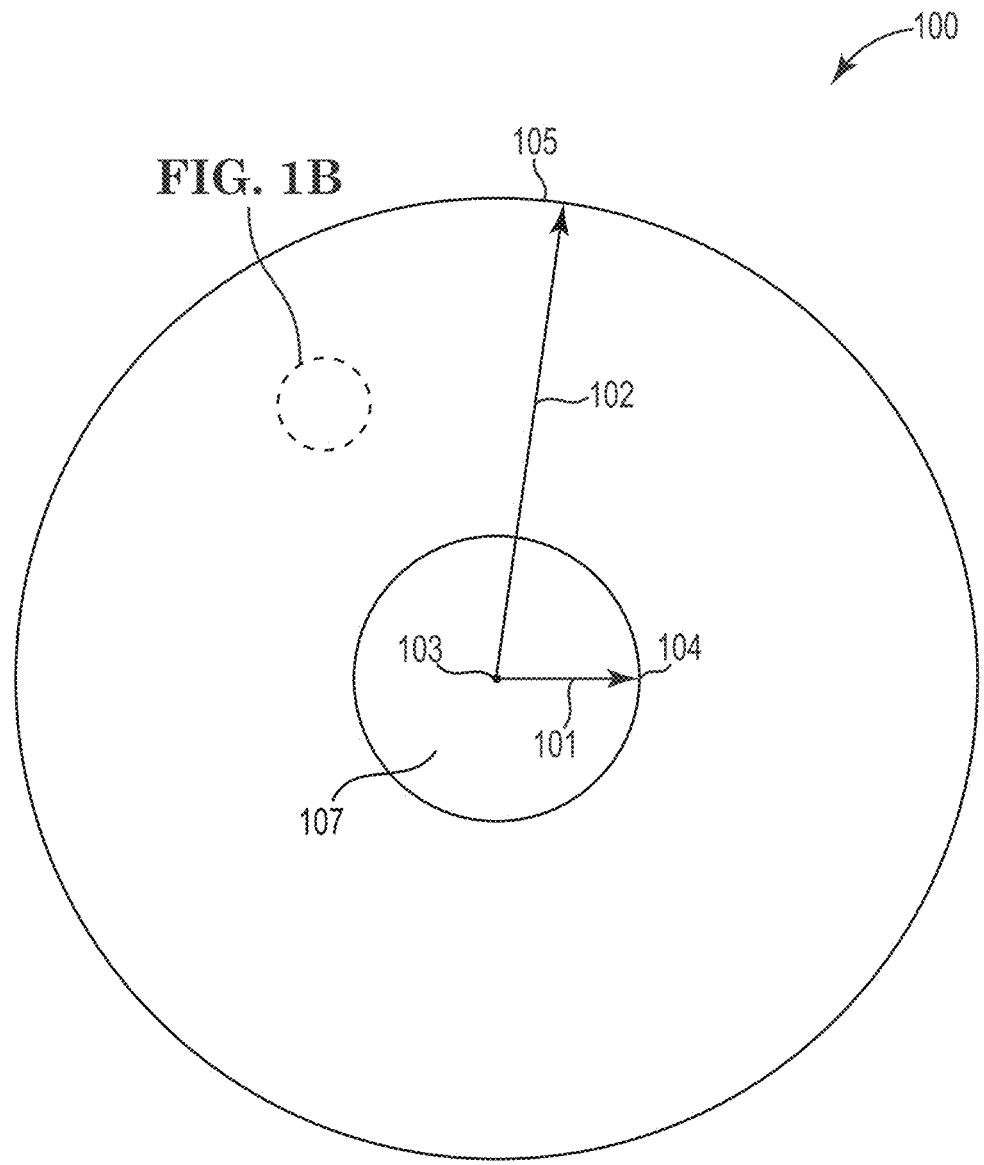
FIG. 1A is a schematic top view of an embodiment of a magnetic recording disk according to the present disclosure.
Figure 1B:
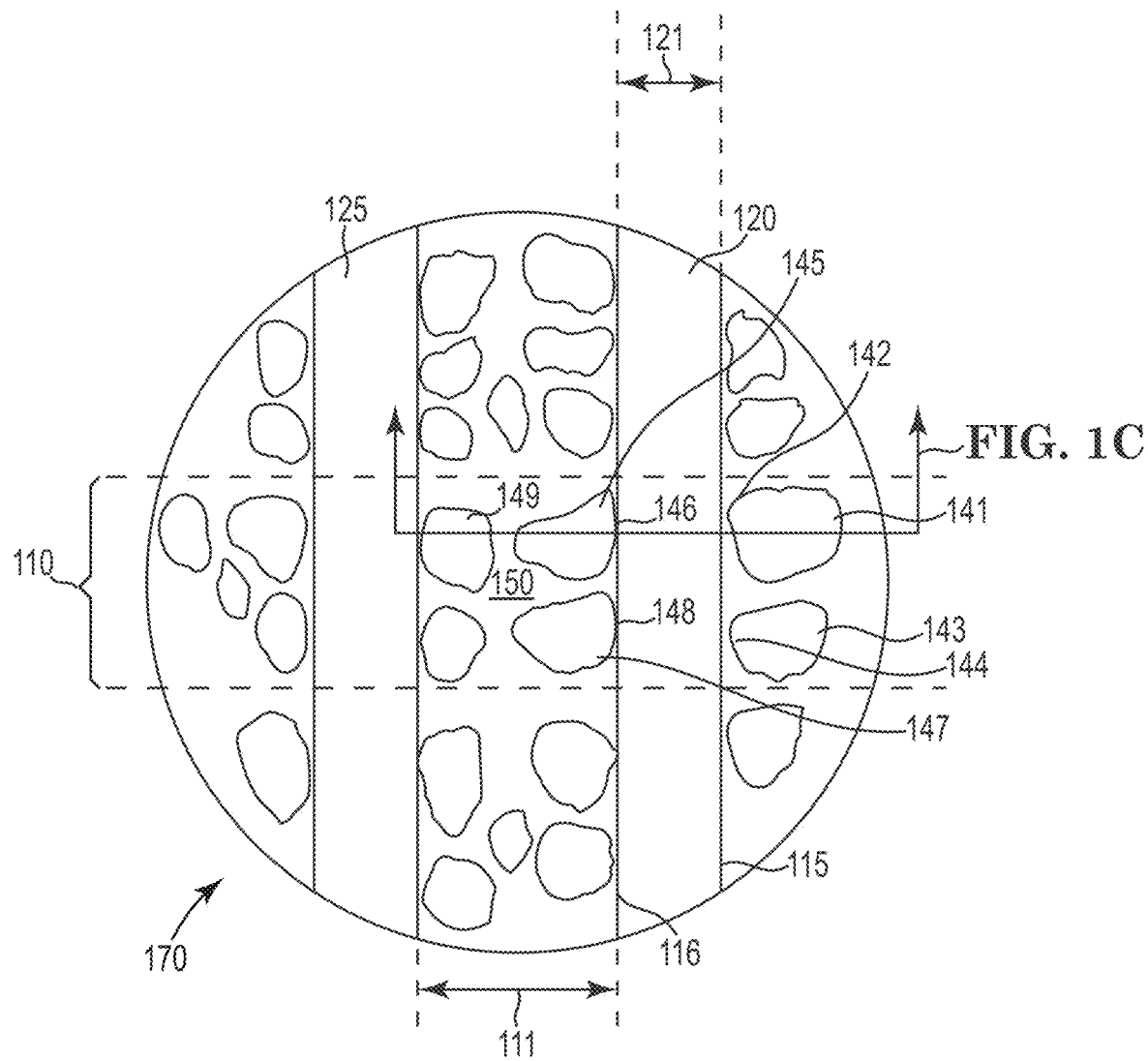
FIG. 1B is a close-up view of a portion of the magnetic layer of the magnetic recording disk shown in FIG. 1A.
Figure 1C:
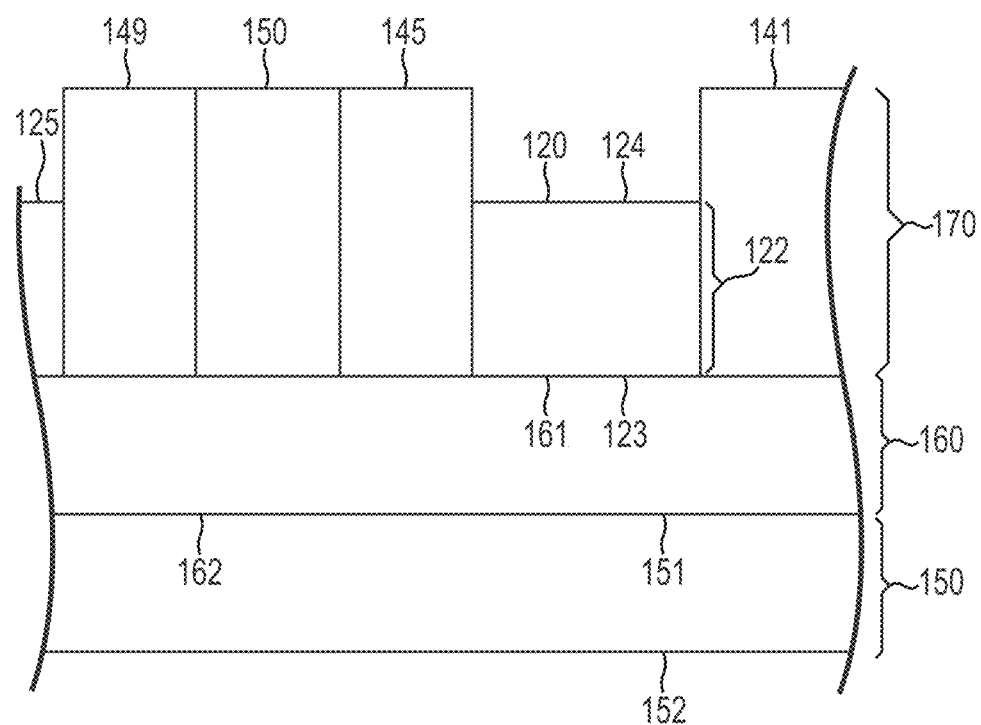
FIG. 1C is a schematic elevation view of a portion of the magnetic recording disk shown in FIG. 1A.

FIG. 1A shows a top view of a magnetic recording disk 100 having a central opening 107 and an outer perimeter 105.

According to the present disclosure, the magnetic recording disk includes three-dimensional segregant structures, which help guide subsequent growth of magnetic grains. As shown FIG. 1B, which is a close-up view of a portion of the magnetic recording layer 170 of the magnetic recording disk 100 shown in FIGS. 1A and 1C, three-dimensional segregant structures 120 and 125. Each of the three-dimensional segregant structures 120 and 125 extend from a first radius to a second radius of the magnetic recording disk 100, where the second radius is longer than the first radius. The first radius and second radius can be any desired lengths. As discussed below, three-dimensional segregant structures can facilitate relatively sharp transitions during, e.g., writing to the magnetic recording disk 100. In some embodiments, the first radius can correspond to approximately the innermost radius of a magnetic disk and the second radius can correspond to approximately the outermost radius of the magnetic disk to provide "full surface" coverage. For example, as shown in FIG. 1A, a first radius can approximately correspond to innermost radius 101, which extends from center 103 of disk 100 to the perimeter 104 of the opening 107. Alternatively, a three-dimensional segregant structure could have a first radius that extends beyond the innermost perimeter 104 of magnetic disk 100 so that the first radius is longer than radius 101. As also shown in FIG. 1A, a second radius can approximately correspond to outermost radius 102, which extends from center 103 of disk 100 to the outer perimeter 105 of disk 100. Alternatively, a three-dimensional segregant structure could have a second radius that extends partially to the outermost perimeter 102 of magnetic disk 100 so that the second radius is shorter than radius 102. It is noted that the first radius may extend "approximately" to the innermost radius of the disk and the second radius may extend "approximately" to the outermost radius of the disk because there may be a "dead zone" at the innermost radius and/or outermost radius due to limitations of patterning at those locations.

Three-dimensional segregant structures can extend in a continuous manner from a first radius to a second radius along a variety of paths. Non-limiting examples of paths include linear (e.g., approximately straight) path from the first radius to the second radius, a curvilinear path from the first radius to the second radius, combinations of these, and the like.

Still referring to FIG. 1B, magnetic recording layer 170 also includes a plurality of magnetic grains 141, 143, 145, 147, and 149 between adjacent three-dimensional segregant structures. As shown, magnetic grains 145, 147, and 149 are between adjacent three-dimensional segregant structures 120 and 125. As discussed below with respect to FIGS. 2A-2G, the three-dimensional segregant structures such as 120 and 125 are formed in magnetic recording layer 170 prior to growing magnetic grains such as magnetic grains 141, 143, 145, 147, and 149 so that at least some of the magnetic grains can grow in an aligned manner with respect to an adjacent edge of a three-dimensional segregant structure. Having at least some magnetic grains aligned in this manner can facilitate relatively sharp transitions during, e.g., writing to the magnetic recording disk 100 as indicated by dashed lines 110.

In more detail, adjacent three-dimensional segregant structure 120 is formed first and then the magnetic grains of magnetic recording layer 170 are formed on nucleation layer 160 (see FIG. 1C). By forming magnetic recording layer 170 in this manner, portion 142 of magnetic grain 141 and portion 144 of magnetic grain 143 are adjacent to edge 115 of three-dimensional segregant structure 120 in an aligned manner. Likewise, portion 146 of magnetic grain 145 and portion 148 of magnetic grain 147 are adjacent to edge 116 of three-dimensional segregant structure 120 in an aligned manner.

Three-dimensional segregant structures according to the present disclosure such as three-dimensional segregant structures 120 and 125 can have a width that is selected based on one or more factors such as, manufacturing capability, magnetic grain density, disk operation, and the like.

For example, it is desirable to have width 121 of three dimensional segregant structure 120 help guide growth of magnetic grains 141, 143, 145, and 147 in an aligned manner while at the same time not permitting growth on top of three dimensional segregant structure 120. Referring to FIG. 1C, three-dimensional segregant structure 120 has a first surface 123 in contact with the surface 161 of nucleation layer 160 and a second surface 124 opposite the first surface 123. As can be seen, the second surface 124 of three-dimensional segregant structure 120 does not have a magnetic grain over second surface 124, which is desirable to maintain the relatively sharp transitions created by edge 115 with respect to adjacent magnetic grains 141 and 143 and created by edge 116 with respect to adjacent magnetic grains 145 and 147. In some embodiments, to help facilitate no grain growth on second surface 124, the width 121 can be selected to be less than half the grain diameter.

As another example, the width of three-dimensional segregant structures 120 and 125 can impact the space that is available for magnetic grains, which impacts the magnetic grain density.

In some embodiments, a three-dimensional segregant structures according to the present disclosure can have a width 121 of 5 nanometers or less, 4 nanometers or less, 3.5 nanometers or less, 3 nanometers or less, 2.5 nanometers or less, or even 2 nanometers or less. In some embodiments, a three-dimensional segregant structures according to the present disclosure can have a width of less than 3 nanometers (e.g., from 0.1 nanometers to less than 3 nanometers).

Three-dimensional segregant structures according to the present disclosure such as three-dimensional segregant structures 120 and 125 can have a pitch that is selected based on one or more factors such as, manufacturing capability, magnetic grain density, disk operation, and the like. As used herein, "pitch" refers the distance between adjacent three-dimensional segregant structures. Referring to FIG. 1B, three-dimensional segregant structures 120 and 125 have a pitch 111. As can be seen, pitch 111 permits one or more (e.g., 2 to 3) magnetic grains to be present between adjacent three-dimensional segregant structures 120 and 125. As the pitch decreases for a given width of three-dimensional segregant structure, then the space that is available for magnetic grains reduces, which impacts the magnetic grain density. In some embodiments, adjacent three-dimensional segregant structures according to the present disclosure can have a pitch of 30 nanometers or less. For example, a pitch from 9 to 30 nanometers, from 9 to 25 nanometers, or even from 9 to 20 nanometers.

Three-dimensional segregant structures according to the present disclosure such as three-dimensional segregant structures 120 and 125 can have a height that is selected based on a variety of factors. As discussed above, one of the main purposes three-dimensional segregant structures according to the present disclosure is to guide subsequent growth of magnetic grains in an aligned manner. Thus, it is desirable that three-dimensional segregant structures according to the present disclosure have a height that at least facilitates subsequent magnetic grain growth. Referring to FIG. 1C, three-dimensional segregant structure 120 has a height 122. As shown in FIG. 1C, height 122 is less than the height of adjacent magnetic grains 141 and 145, but three-dimensional segregant structure 120 could have a height that is substantially the same as adjacent magnetic grains 141 and 145, if desired.

Three-dimensional segregant structures according to the present disclosure include segregant material, which is a non-magnetic material that physically and magnetically decouples/segregates magnetic grains such as magnetic grains 141 and 145. In some embodiments, a segregant material includes one or more oxides, nitrides, carbides, and mixtures thereof. Non-limiting examples of non-magnetic material that can be used as segregant material include BN, BC, C, SiC, SiN, TiC, TiN, CrN, $TiO_2$, $Al_2O_3$, $Nb_2O_5$, $SiO_2$, $MoO_3$, $Cr_2O_3$, $Ta_2O_5$, $ZrO_2$, $V_2O_5$, $WO_3$, $Y_2O_3$, and mixtures thereof. Nonlimiting examples of non-magnetic material that can be used as segregant material in the present disclosure are described in U.S. Pat. Nos. U.S. Pat. No. 7,429,427 (Wu et al.) and U.S. Pat. No. 9,324,353 (Hellwig et al.), wherein the entirety of each of said patents is incorporated herein by reference.

In addition to three-dimensional segregant structures 120 and 125, which are present prior to forming magnetic grains such as 141 and 145, segregant material can be present throughout magnetic layer 170 as segregant material 150, which also physically and magnetically decouples/segregates magnetic grains. Segregant material 150 can be deposited, e.g., when forming magnetic grains as discussed below. The segregant material 150 can be made of the same or different segregant material as three-dimensional segregant structures (e.g., 120 and 125) according to the present disclosure.

Referring to FIG. 1C it can be seen that magnetic recording disk 100 has a variety of layers. By way of example, FIG. 1C shows substrate 150 having a first major surface 151 and a second major surface 152 opposite first major surface 151; a nucleation layer 160 present on the first major surface 151. Nucleation layer 160 has a first major surface 161 and a second major surface 162 opposite first major surface 161. On top of nucleation layer 160 is magnetic recording layer 170 discussed in detail above with respect to FIG. 1B. Although not shown, one or more additional layers can be provided under and/or over magnetic layer 170. Non-limiting examples of such an adhesion layer, a "soft" magnetic underlayer, a protective overcoat (such as of a diamond-like carbon (DLC)) and/or lubricant topcoat (such as of a perfluoropolyether material) as shown in U.S. Pat. No. 7,429,427 (Wu et al.).

According to the present disclosure, a pattern of sacrificial, discrete structures can be formed so that the sacrificial, discrete structures can be used as mandrels to ultimately define three-dimensional segregant structures that have a desirable size, e.g., thin enough to avoid having magnetic grains nucleate on top of the three-dimensional segregant structures while at the same time having boundaries and critical dimensions (e.g., line edge roughness (LER and/or linewidth roughness (LWR)) that facilitate guiding subsequent growth of magnetic grains in an aligned manner. Further, manufacturing three-dimensional segregant structures according to the present disclosure advantageously permits desirable density of three-dimensional segregant structures over a relatively large area.

A non-limiting method of manufacturing three-dimensional segregant structures in a magnetic recording layer for subsequent formation of magnetic grains will now be described in connection with FIGS. 2A-2G. Like FIGS. 1A-1C, FIGS. 2A-2G are not drawn to scale.

FIG. 2A illustrates an initial stack of layers that includes a substrate 201, an interlayer 203, and a layer 205 sacrificial material (to be used a "mandrel" described below).

Substrate 201 can include one or more non-magnetic layers such as layer 150 in FIG. 1C. Substrate 201 can function as the base layer for a magnetic recording medium and include materials which allow deposition of one or more additional media layers at elevated temperatures, e.g., on the order of 600-700° C. Substrate 201 can be made of glass, ceramic, glass-ceramic, polymeric material, or a composite or laminate of these materials. Non-limiting examples of specific materials that can be used in substrate 201 include chromium, chromium alloy, aluminum, aluminum alloy, silicon, quartz, combinations of these and the like. In some embodiments, layer 150 is non-magnetic metal or alloy. Substrate 201 can have a thickness in the range from 5 nm to 100 nm, or even from 10 nm to 100 nm.

Layer 203 can include one or more layers (such as a nucleation layer 160 in FIG. 1C) deposited on layer 201. Layer 203 can also be referred to as a non-magnetic seed or underlayer (sometimes referred to as an "intermediate" layer or as an "interlayer"), and serves to (1) prevent magnetic interaction between any soft magnetic underlayer that may be present and one or more "hard" recording layers such as magnetic recording layer 170 in FIG. 1C; (2) promote desired microstructural and magnetic properties of the at least one magnetically hard recording layer such as 170, e.g., by serving to establish a crystallographically oriented base layer for inducing growth of a desired plane in the overlying perpendicular magnetically hard recording film or layer; and/or (3) establish a high surface roughness in order to induce grain separation in the magnetically hard recording layer.

Layer 203 can be made out of one or more non-limiting non-magnetic materials such as magnesium oxide (MgO), MTO, Ru, TiCr, $Ru/CoCr_{37}Pt_6$, RuCr/CoCrPt, combinations of these, and the like. Layer 203 can have a thickness in the range from 0.5 nm to 30 nm, or even from 1 nm to 20 nm.

Layer 205 can be a single layer or one or more layers of sacrificial material that can be patterned into a plurality of sacrificial, discrete structures as described below in FIG. 2C. According to the present disclosure, "sacrificial, discrete structures" (also referred to as "sacrificial mandrels") are used as mandrels to shape a layer of segregant material coated over the sacrificial, discrete structures in a conforming manner so that a portion of the layer of segregant material can be removed to form the three-dimensional segregant structures as shown in FIG. 2G below.

In some embodiments, nanoimprint lithography (NIL) technology can be used to form sacrificial, discrete structures directly into layer 205 so layer 205 includes a material that can be formed into sacrificial, discrete structures via the nanoimprinting. Nanoimprinting lithography creates patterns by mechanical deformation of imprint resist material, which can be a monomer or polymer formulation that is cured during the imprinting (mechanical deformation) process. A wide variety of organic monomers or polymers can be used as imprint resist materials and can be positive-tone and/or negative-tone resist materials. Non-limiting examples of curing include thermal curing, ultraviolet light curing, combinations of these, and the like. Accordingly, in some embodiments, the sacrificial material can include imprint resist material. The imprint resist material can be selected to be used as a mandrel to shape a layer of segregant material into three-dimensional segregant structures, while at the same time being able to be selectively removed relative to the segregant material used to form the three-dimensional segregant structures. A non-limiting example of using nanoimprint lithography in the context of manufacturing a magnetic recording layer in a magnetic recording disk is described in U.S. Pat. No. 7,986,493 (Weller et al.), wherein the entirety of said patent is incorporated by reference.

Layer 205 can have a variety of thicknesses that can be selected based on the pattern that is formed into layer 205 as discussed in FIG. 2B below as well as the height 242 of three-dimensional segregant structures (e.g., three-dimensional segregant structure 231) discussed below in FIG. 2G. In some embodiments, layer 205 can have thickness of 50 nanometers (nm) or less, 30 nm or less, 20 nm or less, 15 nm or less, 10 nanometers or less, or even 5 nanometers or less. In some embodiments, layer 205 can have thickness of from 0.5 to 50 nm, from 0.5 to 30 nm, from 1 to 15 nanometers, or even from 1 to 5 nanometers.

When using imprint resist material as the sacrificial material for layer 205, the imprint resist material can be coated onto layer 203 while it is uncured. The uncured, imprint resist material can be applied in any desired manner such as by inkjet dispensing and/or spin-coating. After coating the uncured imprint resist material, an embossing mold/template 290 can be used to form a pattern that includes features 219 and 221 in the uncured imprint resist material. The embossing mold includes features to be reproduced into the imprint resist material in layer 205. Each of the features in the embossing mold help define dimensions (e.g., height, width, and length) that correspond to the dimensions of a pattern to be reproduced in the cured p imprint resist material. As mentioned above, the uncured imprint resist material can be cured by exposing it to ultraviolet radiation and/or thermal radiation to at least partially cure (e.g., to substantially completely cure) the uncured imprint resist material so that the cured imprint resist material maintains the pattern that corresponds to the embossing mold after the embossing mold is removed. It is noted that adhesion between cured imprint resist material and template 290 can be controlled to allow release without undue adhesion between cured imprint resist material and template 290.

A variety of three-dimensional shapes and sizes can be selected for sacrificial, discrete structures 219 and 221. Similar to the three-dimensional segregant structures 120 and 125 in FIG. 1B, sacrificial, discrete structure 219 and 221 extend continuously along a direction from a first radius of a magnetic disk to a second radius of the magnetic disk. And as shown in FIG. 2B, sacrificial, discrete structure 219 and 221 are truncated triangles in cross-section. Alternatively, a wide variety of cross-sectional shapes could be used instead since only a portion of the corresponding sacrificial, discrete structures 219 and 221 near layer 203 are used to define three-dimensional segregant structures, such as 231, after etching coating 230, discussed below.

As shown in FIG. 2B, sacrificial, discrete structures 219 and 221 have a height 223, a width 225, and a pitch 217. The height 223 in part defines (along with how much etching is performed) the height 242 of three-dimensional segregant structures such as 231, which is discussed below. The width 225 determines pitch 240 of three-dimensional segregant structures shown in FIG. 2G and discussed below. The pitch 217, along with the thickness of coating 230, determines the pitch 241 of three-dimensional segregant structures, which is discussed below in FIG. 2G. As used with respect to 217, "pitch" refers to the distance between adjacent sacrificial, discrete structures. In some embodiments, adjacent sacrificial, discrete structures according to the present disclosure can have a pitch of 60 nanometers or less. For example, a pitch from 10 to 50 nanometers, or even from 15 to 40.

Figure 2E:
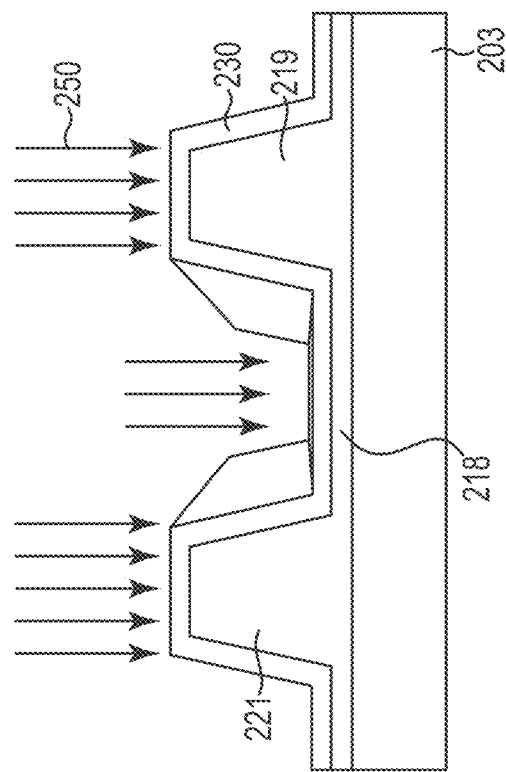
FIG. 2E is a schematic elevation view of an alternative embodiment of FIG. 2D.
Figure 2D:
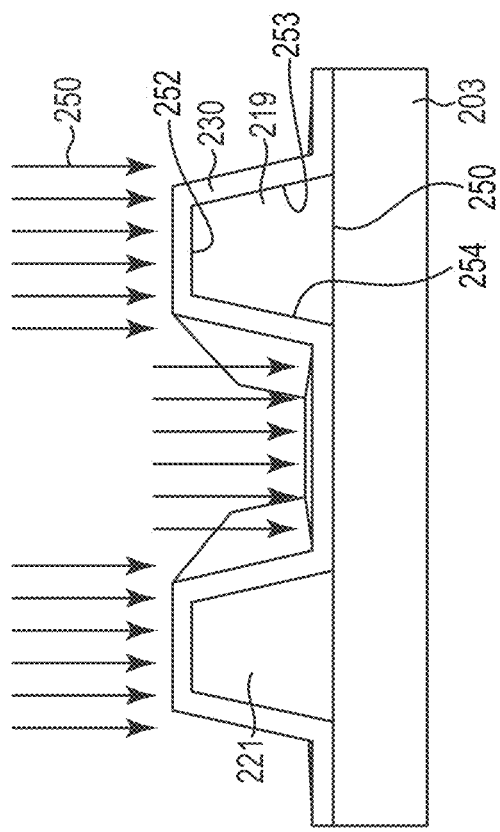

Referring to FIG. 2D, sacrificial, discrete structure 219 is has a cross-sectional shape in the form of a triangle and has one side or base 251 in contact with a major surface of the interlayer 203. The remaining three sides 252, 253, and 254 of 219 form an exterior surface having a shape of the truncated triangle in cross-section. As can be seen, end 252 is opposite the base 251.

The pattern or periodicity of sacrificial, discrete structures such as 219 and 221 can be selected as desired. For example, the sacrificial, discrete structures such as 219 and 221, along with dimensions 223, 225, and 217, can be repeated across a portion or the entire magnetic recording layer of the corresponding magnetic recording disk.

In some embodiments, after forming the pattern into layer 205, an etching process can be used to remove at least a portion of the imprint resist material. For example, in some embodiments, as shown in FIG. 2D, any residual imprint resist material from layer 105 that is between sacrificial, discrete structures 219 and 221, if present, can be removed along with a portion of imprint resist material from the tops of sacrificial, discrete structures such as 219 and 221, thereby leaving only sacrificial, discrete structures 219 and 221 on interlayer 203 and exposing the interlayer 203 between sacrificial, discrete structures 219 and 221. Accordingly, because a portion of the tops of sacrificial, discrete structures 219 and 221 may be removed when removing imprint resist material that is between sacrificial, discrete structures 219 and 221, the height 223 can be a factor to consider when forming sacrificial, discrete structures 219 and 221 because the height 223 may impact the height of 242 height 242 of three-dimensional segregant structures such as 231. Alternatively, in some embodiments, as shown in FIG. 2E, only a portion of imprint resist material is removed, thereby leaving a residual thickness 218 of imprint resist material from layer 205 between sacrificial, discrete structures 219 and 221. Such a residual thickness of sacrificial material can protect the interlayer 203 during subsequent etching of segregant material in coating 230. For example, if the coating 230 of segregant material is etched with a dry plasma etch process (e.g., $CF_4$ RIE) then the residual thickness 218 can help protect the interlayer 203 after removing the segregant material and exposing interlayer 203 when the portion of segregant coating 230 between sacrificial, discrete structures 219 and 221 is removed. In some embodiments, the residual thickness 218 can be 20 nm or less, 15 nm or less, or even 10 nanometers or less. In some embodiments, the residual thickness 218 can be from 3 to 10 nm, or even from 5 to 10 nm.

A non-limiting example of such an etching process to remove cured, imprint resist material includes a plasma etching process such as an oxygen, plasma RIE process (e.g., descum etch).

After forming the plurality of sacrificial, discrete structures on a substrate, at least one layer of segregant material can be deposited over the sacrificial, discrete structures so that the at least one layer of segregant material conforms to the shape of the exterior surface of each sacrificial, discrete structure. For example, as shown in FIG. 2C, a layer 230 of segregant material is deposited over sacrificial, discrete structures 219 and 221. As can be seen in FIG. 2C, the layer 230 conforms to the exterior shape of sacrificial, discrete structure 219 defined by sides 252, 253, and 254. The layer 230 of segregant material can be selected from any of the materials discussed above with respect to three-dimensional segregant structure 120.

The thickness of layer 230 on sidewalls 253 and 254 determines the width 243 of three dimensional segregant structure 231, which corresponds to the width 121 of three dimensional segregant structure 120 discussed above.

Coating 230 can be deposited by a variety of techniques such as sputtering (physical vapor deposition (PVD)), chemical vapor deposition (CVD), atomic layer deposition (ALD), vacuum thermal evaporation, electron beam evaporation, laser beam evaporation, combinations of these, and the like.

Coating 230 can be selected from a wide variety of segregant materials as discussed above with respect to three-dimensional segregant structure 120. Also, as mentioned above with respect to sacrificial layer 205, the material for sacrificial layer 205 is selected to be different from coating 230 so that coating 230 can be selectively removed relative to sacrificial, discrete structures such as 219 and 221.

After applying at least one layer of segregant material, a portion of the at least one layer can be "directionally" removed toward the underlying substrate and selectively removed relative to the sacrificial, discrete structures (does not remove sacrificial, discrete structures) so that a portion of the segregant material remains to define the three-dimensional segregant structures when subsequently removed the sacrificial mandrels to expose the underlying interlayer and deposit magnetic grains. Referring to FIGS. 2D and 2F, the at least one layer of segregant material 230 is removed in a direction as indicated by arrows 250 from the end 252 of sacrificial, discrete structure 219 toward the nucleation layer 203 to expose at least the end 252 of sacrificial, discrete structure 219 and a portion of each of sidewalls 253 and 254. A portion of layer 230 along each of sidewalls 253 and 254 remains in contact with nucleation layer 203 to define the three-dimensional segregant structures 231 and 233.

A portion of the at least one layer 230 can be "directionally" removed toward the underlying substrate using any desired technique such as dry etching process. A non-limiting example of such a dry etching process includes a plasma etching process such as $CF_4$ RIE. Any desired etching conditions can be selected to remove a portion of layer 230 as described herein.

The sacrificial, discrete structures can be removed to expose the underlying substrate so that magnetic grains and additional segregant material can be deposited between the three-dimensional segregant structures. Referring to FIGS. 2F and 2G, the sacrificial, discrete structures 219 and 221 can be "directionally" removed toward the underlying nucleation layer 203 to expose nucleation layer 203 and selectively removed relative to the three-dimensional segregant structures 231, 233, 235, and 237 (does not remove the three-dimensional segregant structures).

In some embodiments, because the cured imprint resist material can be crosslinked due to curing, the sacrificial, discrete structures can be "directionally" removed toward the underlying substrate using a dry etching process. A non-limiting example of a dry etching process includes a plasma dry etching process such as oxygen RIE. Any desired etching conditions can be selected to remove the sacrificial, discrete structures as described herein.

Referring to FIG. 2G, the three-dimensional segregant structures 231, 233, 235, and 237 remain and are ready to have the remainder of the magnetic layer formed by depositing magnetic grains and additional segregant material between adjacent three-dimensional segregant structures. As can be seen, each three-dimensional segregant structures 231, 233, 235, and 237 has a height, a width, and two sidewalls. For example, three-dimensional segregant structure 231 has a height 242 and a width 243.

The height 242 of three-dimensional segregant structure 231 is similar to height 122 discussed above in FIG. 1C. As mentioned, three-dimensional segregant structures according to the present disclosure can have a height that at least facilitates subsequent magnetic grain growth. In some embodiments, three-dimensional segregant structures according to the present disclosure can have a height of 15 nm or less, 10 nm or less, 5 nm or less, or even 3 nm or less. In some embodiments, three-dimensional segregant structures according to the present disclosure can have a height from 1 nm to 15 nm.

The width 243 of three-dimensional segregant structure 231 is similar to width 121 discussed above in FIG. 1B. As mentioned, three-dimensional segregant structures according to the present disclosure can have a width to help guide subsequent growth of magnetic grains in an aligned manner while at the same time not permitting growth on top of three dimensional segregant structure, which is desirable to maintain the relatively sharp transitions created by the aligned growth. Also, the width of three-dimensional segregant structures can impact the space that is available for magnetic grains, which impacts the magnetic grain density.

In some embodiments, a three-dimensional segregant structures according to the present disclosure can have a width 243 of 5 nanometers or less, 4 nanometers or less, 3.5 nanometers or less, 3 nanometers or less, 2.5 nanometers or less, or even 2 nanometers or less. In some embodiments, a three-dimensional segregant structures according to the present disclosure can have a width 243 of less than 3 nanometers (e.g., from 0.1 nanometers to less than 3 nanometers).

As shown in FIG. 2G, three-dimensional segregant structure 231 also has two sidewalls 245 and 246 that protrude from the major surface of interlayer 203. The sidewalls 245 and 246 extend continuously along a direction from a first radius of a magnetic disk to a second radius of the magnetic disk.

The pitch 240 of three-dimensional segregant structure 231 and 233 is determined by the width 225 of sacrificial, discrete structures 219 and is similar to pitch 111 discussed above in FIG. 1B. As mentioned, pitch permits one or more (e.g., 2 to 3) magnetic grains to be present between adjacent three-dimensional segregant structures. As the pitch decreases for a given width of three-dimensional segregant structure, then the space that is available for magnetic grains reduces, which impacts the magnetic grain density. As mentioned above, in some embodiments, adjacent three-dimensional segregant structures according to the present disclosure can have a pitch of 30 nanometers or less. For example, a pitch from 9 to 30 nanometers, from 9 to 25 nanometers, or even from 9 to 20 nanometers.

The pitch 241 of three-dimensional segregant structure 233 and 235 is determined by the pitch 217 of sacrificial, discrete structures 219 and 221, and the thickness of coating 230. Pitch 241 can be the same or different from pitch 240. In some embodiments, the pitch 240 is the same as pitch 241 and is one-half of the pitch 217.

As mentioned, after removing the sacrificial, discrete structures to expose the underlying nucleation layer, the remainder of the magnetic layer can be formed by any desired method of depositing magnetic grains and additional segregant material between adjacent three-dimensional segregant structures.

Magnetic grains and/or additional segregant material can be deposited by sputtering. The size of magnetic grains can be from 5 to 15 nanometers, or even from 8 to 10 nanometers.

Additional segregant material is discussed above with respect to segregant material 150.

Non-liming examples of magnetic material for forming magnetic grains includes FePt among many others.

A non-limiting example of forming magnetic grains and additional segregant material is described in U.S. Pat. No. 9,324,353 (Hellwig et al.), wherein the entirety of said patent is incorporated herein by reference

EXAMPLE

An example of forming three-dimensional segregant structures according to the present disclosure was performed via imprint lithography and in a manner similar to that described above with respect to FIGS. 2A-2D and 2F-2G.

A 20-30 nm thick sacrificial, mandrel layer 205 of imprint resist was coated onto a nucleation layer 203, MTO, as similarly illustrated in FIG. 2A.

Then, 1 as similarly illustrated in FIG. 2B, a quartz template like 290 having a line pattern with a pitch was used to imprint the pattern of the template into the layer 205 of imprint resist and form a plurality of sacrificial, discrete structures such as 219 and 221. After imprinting the pattern with template 290, the imprint resist material in the "trenches" between adjacent sacrificial, discrete structures, such as 219 and 221, was removed. Here, an oxygen plasma descum etch was performed for 10-15 seconds to remove the imprint resist material. This oxygen plasma descum etch also removed a portion of imprint resist material from the tops of the sacrificial, discrete structures since oxygen plasma descum etching is a "directional" etching process.

Then, as similarly illustrated in FIGS. 2C and 2D, a 2-5 nm thick $SiO_2$ segregant layer was deposited over the sacrificial, discrete structures and the exposed MTO layer 203 between the sacrificial, discrete structures.

Then, as similarly illustrated in FIG. 2F, a directional, dry etching process was performed to selectively etch away segregant $SiO_2$ on top of the sacrificial, discrete structures and nucleation layer 203 between the sacrificial, discrete structures, leaving only a portion of the segregant layer along the sidewalls of each sacrificial, discrete structure. Here $CF_4$ RIE was used for the dry etching process.

Finally, as similarly illustrated in FIG. 2G, the sacrificial, discrete structures were removed to expose the underlying nucleation layer 203 between each pair of three-dimensional segregant structures (segregant sidewalls) extending from nucleation layer 203. Here oxygen RIE was used to etch away the sacrificial, discrete structures. In is noted that the three-dimensional segregant structures had a width (~3 nm), which was determined by the deposition thickness of $SiO_2$ (such as 2-5 nm thick). The three-dimensional segregant structure height (such as 2-5 nm in the height) is determined by the $CF_4$ etch process, such as the etch time. The final pitch of the three-dimensional segregant structures was half of the pitch of the sacrificial, discrete structures.

Figure 3:
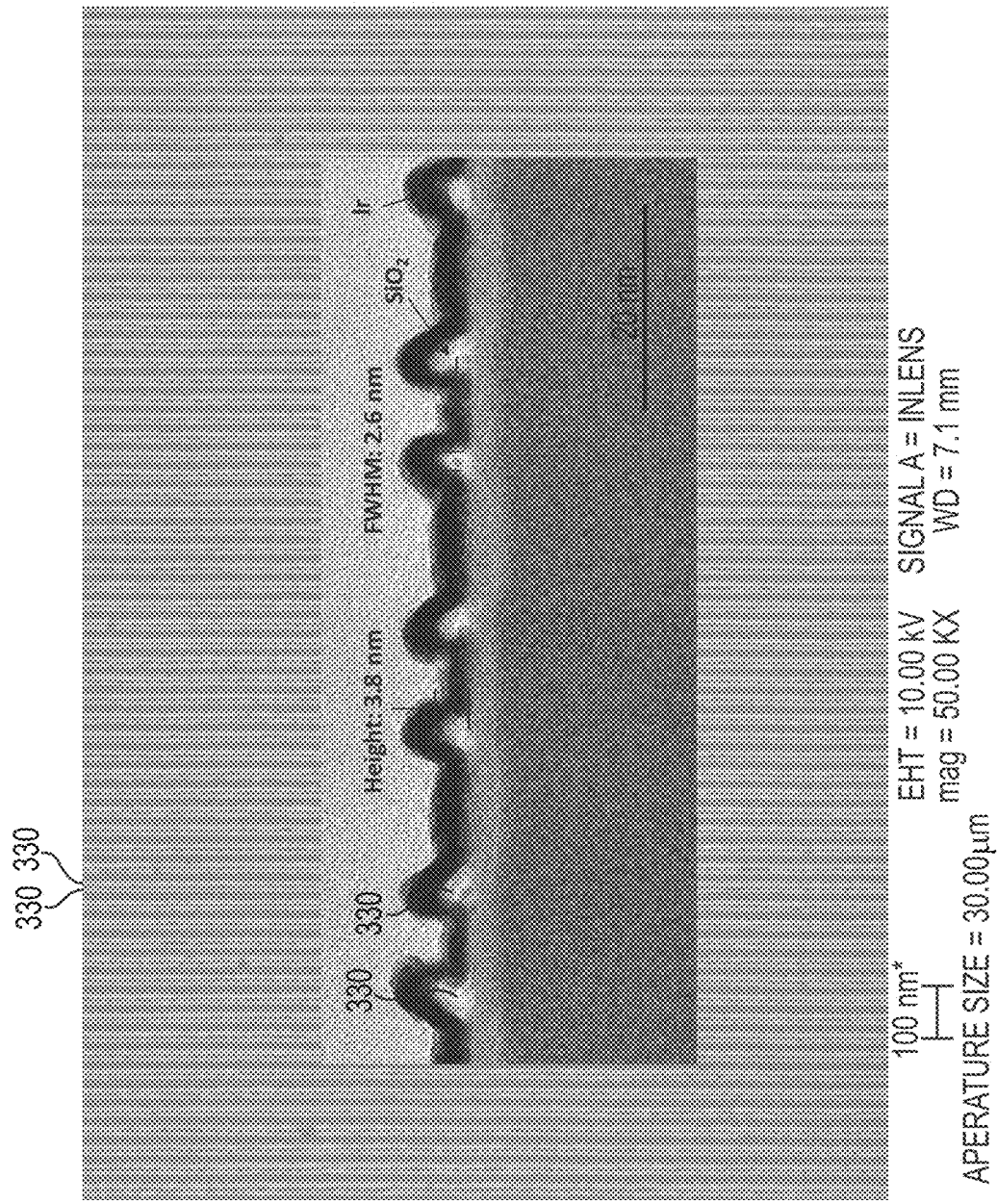
FIG. 3 is a scanning electron microscopy (SEM) image of the segregant lines in the Example along with an inset transmission electron microscopy (TEM) image of a portion of the SEM image.

FIG. 3 is a top view of an SEM of linear, three-dimensional segregant structures 330 extending in approximately straight lines. The linear, three-dimensional segregant structures 330 are the light lines. FIG. 3 also includes an inset image that is a cross-section, transmission electron microscopy (TEM) image of a portion of the SEM image of FIG. 3. The linear, three-dimensional segregant structures 330 are the light lines. The dark outline is iridium used for contrast.

What is claimed is:

1. A method of manufacturing at least a portion of a magnetic layer of a magnetic recording disk, wherein the method comprises:
    providing a substrate having at least a first major surface;
    forming a pattern on the first major surface of the substrate, wherein the pattern comprises a plurality of sacrificial, discrete structures, wherein each sacrificial, discrete structure comprises imprint resist material, wherein each sacrificial, discrete structure extends from a first radius of the recording disk to a second radius of the recording disk, and wherein each sacrificial, discrete structure comprises:
        a base in contact with the first major surface of the substrate; and
        an exterior surface having a shape, wherein the exterior surface comprises an end that is opposite the base;
    depositing at least one layer of segregant material so that the at least one layer of segregant material conforms to the shape of the exterior surface of each sacrificial, discrete structure;
    removing a portion of the at least one layer of segregant material in a direction from the end of each sacrificial, discrete structure toward the substrate to expose at least the end of each sacrificial, discrete structure, wherein a portion of the at least one layer of segregant material remains to define a plurality of three-dimensional segregant structures in contact with the first major surface of the substrate; and
    removing each sacrificial, discrete structure to expose the substrate and so that each three-dimensional segregant structure has at least two sidewalls that protrude from the substrate, wherein each three-dimensional segregant structure extends from the first radius of the recording disk to the second radius of the recording disk.

2. The method of claim 1, wherein the substrate comprises a plurality of layers, wherein at least one of the layers comprises a nucleation layer, and wherein the nucleation layer comprises the first major surface.

3. The method of claim 2, wherein forming the pattern comprises:
    depositing at least one layer of sacrificial material over the first major surface;
    contacting the at least one layer of sacrificial material with a template to form the pattern in at least one layer of sacrificial material.

4. The method of claim 3, wherein the sacrificial material comprises imprint resist material.

5. The method of claim 4, further comprising removing all of the imprint resist material between adjacent sacrificial, discrete structures to expose the first major surface of the nucleation layer.

6. The method of claim 5, wherein the imprint resist material is removed via a plasma etch process.

7. The method of claim 6, wherein the plasma etch process comprises an oxygen plasma descum etch process.

8. The method of claim 4, further comprising removing a portion of the imprint resist material, thereby leaving a residual thickness of the imprint resist material between adjacent sacrificial, discrete structures when depositing the at least one layer of segregant material.

9. The method of claim 4, wherein each sacrificial, discrete structure extends continuously from a first radius of the recording disk to a second radius of the recording disk.

10. The method of claim 1, wherein adjacent sacrificial, discrete structures have a pitch in a range from 10 nanometers to 50 nanometers.

11. The method of claim 1, wherein the at least one layer of segregant material has a thickness of 3 nanometers or less.

12. The method of claim 1, wherein removing a portion of the at least one layer of segregant material comprises a dry etching process to remove a portion of the at least one layer of segregant material, wherein the dry etching process does not remove the plurality of sacrificial, discrete structures.

13. The method of claim 1, wherein removing a portion of the at least one layer of segregant material comprises a first dry etching process to remove a portion of the at least one layer of segregant material, wherein the first dry etching process does not remove the plurality of sacrificial, discrete structures, wherein removing each sacrificial, discrete structure comprises a second dry etching process to remove each sacrificial, discrete structure, and wherein the second dry etching process does not remove the plurality of three-dimensional segregant structures.

14. The method of claim 1, wherein adjacent three-dimensional segregant structures have a pitch that is equal to the pitch of adjacent sacrificial, discrete structures divided by two.

15. The method of claim 1, wherein adjacent three-dimensional segregant structures have a pitch of 30 nanometers or less.

16. The method of claim 1, wherein each three-dimensional segregant structure has a width of 3 nanometers or less.

17. The method of claim 1, wherein each three-dimensional segregant structure has a height of 10 nanometers or less.

18. The method of claim 1, further comprising forming a plurality of magnetic grains on the exposed substrate and between adjacent three-dimensional segregant structures.

19. The method of claim 18, wherein the segregant material is a first segregant material, wherein forming a plurality of magnetic grains comprises sputtering magnetic material and a second segregant material, wherein the first segregant material is the same as the second segregant material or is different from the second segregant material.

20. The method of claim 18, wherein each three-dimensional segregant structure has a first surface in contact with the first major surface of the substrate and a second surface opposite the first surface, wherein the second surface of each three-dimensional segregant structure does not have a magnetic grain in contact with the second surface.

* * * * *